United States Patent
Kyun et al.

(10) Patent No.: US 12,037,704 B2
(45) Date of Patent: *Jul. 16, 2024

(54) SILICON CARBIDE WAFER AND METHOD OF MANUFACTURING SAME

(71) Applicant: Senic Inc., Chungcheongnam-do (KR)

(72) Inventors: Myung Ok Kyun, Gyeonggi-do (KR); Kap Ryeol Ku, Gyeonggi-do (KR); Jung Gyu Kim, Gyeonggi-do (KR); Jung Woo Choi, Gyeonggi-do (KR); Jung Doo Seo, Gyeonggi-do (KR); Jong Hwi Park, Gyeonggi-do (KR)

(73) Assignee: SENIC INC., Chungcheongnam-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/980,731

(22) Filed: Nov. 4, 2022

(65) Prior Publication Data

US 2023/0140873 A1    May 11, 2023

(30) Foreign Application Priority Data

Nov. 5, 2021  (KR) .................. 10-2021-0151813

(51) Int. Cl.
 *B32B 3/00*   (2006.01)
 *C30B 23/02*  (2006.01)
 *C30B 29/36*  (2006.01)

(52) U.S. Cl.
 CPC ............. *C30B 29/36* (2013.01); *C30B 23/02* (2013.01)

(58) Field of Classification Search
 CPC .................. C30B 29/36; C30B 23/02
 See application file for complete search history.

(56) References Cited

U.S. PATENT DOCUMENTS

| 10,822,720 | B1 | 11/2020 | Park et al. |
| 11,708,644 | B2 * | 7/2023 | Park .................. B24B 7/228 428/64.1 |

(Continued)

FOREIGN PATENT DOCUMENTS

| CN | 102422387 A | 4/2012 |
| CN | 110857476 A | 3/2020 |

(Continued)

OTHER PUBLICATIONS

Jung-Woo Choi et al., Quality improvement of 4" 4H-SiC crystal by using modified seed adhesion method, Materials Science Forum, May 15, 2017, pp. 11-14, vol. 897, 2017 Trans Tech Publications, Switzerland.

(Continued)

*Primary Examiner* — Elizabeth E Mulvaney
(74) *Attorney, Agent, or Firm* — IP & T GROUP LLP

(57) ABSTRACT

Disclosed are a silicon carbide wafer and a method of manufacturing the same. The silicon carbide wafer includes an upper surface and a lower surface, the upper surface includes a first target region, the first target region being within 85% of a radius of the upper surface based on a center of the upper surface, a first peak omega angle measured at intervals of 15 mm in a first direction in the first target region is within −1° to +1° based on a peak omega angle measured at the center of the upper surface, and the first direction is a [1-100] direction and a direction passing through the center of the upper surface.

14 Claims, 7 Drawing Sheets

(56) References Cited

U.S. PATENT DOCUMENTS

| | | |
|---|---|---|
| 2011/0015592 A1 | 1/2011 | Svedman et al. |
| 2016/0215414 A1 | 7/2016 | Nakabayashi et al. |
| 2021/0123157 A1 | 4/2021 | Park et al. |
| 2021/0123160 A1 | 4/2021 | Park et al. |
| 2022/0020852 A1 | 1/2022 | Park et al. |
| 2022/0157944 A1 | 5/2022 | Park et al. |
| 2022/0341055 A1 | 10/2022 | Park et al. |

FOREIGN PATENT DOCUMENTS

| | | |
|---|---|---|
| CN | 113186601 A | 7/2021 |
| JP | 2011-222750 A | 11/2011 |
| JP | 2015-063435 A | 4/2015 |
| JP | 5991161 B2 | 9/2016 |
| JP | 2017-114728 A | 6/2017 |
| JP | 2018039715 A | 3/2018 |
| KR | 10-1713006 B1 | 3/2017 |
| KR | 10-2068933 B1 | 1/2020 |
| KR | 10-2104751 B1 | 4/2020 |
| KR | 10-2160863 B1 | 9/2020 |
| KR | 10-2187449 B1 | 12/2020 |
| KR | 10-2192518 B1 | 12/2020 |
| KR | 10-2234002 B1 | 3/2021 |
| KR | 10-2245213 B1 | 4/2021 |
| KR | 10-2021-0050835 A | 5/2021 |
| KR | 10-2021-0050856 A | 5/2021 |
| TW | 202117104 A | 5/2021 |
| TW | 202117107 A | 5/2021 |

OTHER PUBLICATIONS

K. W. Kirchner et al., Mosaicity and Wafer Bending in SiC Wafers as Measured by Double and Triple Crystal X-Ray Rocking Curve and Peak Position Maps, Materials Science Forum, Sep. 1, 2017, pp. 213-218, vols. 556-557, Trans Tech Publications, Switzerland.

M. Yoganathan et al., Characterization of SiC Substrates Using X-Ray Rocking Curve Mapping, Materials Science Forum, Oct. 1, 2006, pp. 729-732, vols. 527-529, Trans Tech Publications, Switzerland.

Hirotaka Yamaguchi et al., Threading Screw Dislocations in 4H-SiC Wafer Observed by the Weak-Beam Method in Bragg-Case X-ray Topography, Journal of Electronic Materials, Mar. 24, 2010, pp. 715-718, vol. 39, No. 6.

Tuerxun Ailihumaer et al., Relationship Between Basal Plane Dislocation Distribution and Local Basal Plane Bending in PVT-Grown 4H-SiC Crystals, Topical Collection: 61st Electronic Materials Conference 2019, Journal of Electronic Materials, Jan. 21, 2020, pp. 3455-3464, vol. 49, No. 6, The Minerals, Metals & Materials Society.

Extended European Search Report for the European Patent Application No. 22205065.0 issued by the European Patent Office on Feb. 15, 2023.

Office Action for the Japanese Patent Application No. 2022-175539 issued by the Japanese Patent Office on Oct. 17, 2023.

Office Action for the Taiwanese Patent Application No. 111141918 issued by the Taiwanese Patent Office on Sep. 7, 2023.

* cited by examiner

SILICON CARBIDE WAFER AND METHOD OF MANUFACTURING SAME

CROSS-REFERENCE TO RELATED APPLICATION

This application claims benefit of priority to Korean Patent Application No. 10-2021-0151813 filed on Nov. 5, 2021 in the Korean Intellectual Property Office, the disclosure of which is incorporated herein by reference in its entirety.

TECHNICAL FIELD

The present invention relates to a silicon carbide wafer and a method of manufacturing the same.

BACKGROUND ART

Single crystals of silicon carbide (SiC), silicon (Si), gallium nitride (GaN), sapphire ($Al_2O_3$), gallium arsenide (GaAs), aluminum nitride (AlN), and the like exhibit characteristics that cannot be expected from polycrystals thereof, and thus demands therefor in the industrial field are increasing.

Single crystal SiC has a large energy band gap and the maximum breakfield voltage and thermal conductivity thereof are superior to those of silicon (Si). In addition, the carrier mobility of single crystal SiC is comparable to that of silicon, and the electron saturation drift rate and breakdown voltage thereof are also high. Due to these characteristics, single crystal SiC is expected to be applied to semiconductor devices that require high efficiency, high breakdown voltage, and high capacity.

Silicon carbide is grown by liquid phase epitaxy (LPE), seed sublimation, chemical vapor deposition (CVD), or the like. Among the methods, seed sublimation is most widely used since the method can produce ingot-shaped silicon carbide with a high growth rate, and is also referred to as physical vapor transport (PVT).

As a method of preparing such a single crystal, for example, Japanese Patent Publication No. 2001-114599 discloses the growth of a single crystal ingot on a seed crystal by, while heating by a heater in a vacuum vessel (heating furnace), into which argon gas can be introduced, maintaining the temperature of the seed crystal at a temperature lower by 10-100° C. than the temperature of raw material powder. In addition, there are attempts to produce single crystal ingots having large diameter without substantial defects.

DISCLOSURE

Technical Problem

Therefore, the present invention has been made in view of the above problems, and it is one object of the present invention to provide a silicon carbide wafer having improved mechanical properties, excellent crystallinity, and fewer defects, and a method of manufacturing the same.

Technical Solution

In accordance with one aspect of the present invention, provided is a silicon carbide wafer including an upper surface and a lower surface, wherein the upper surface includes a first target region, the first target region being within 85% of a radius of the upper surface based on a center of the upper surface, and in the first target region, a first peak omega angle in a rocking curve measured at intervals of 15 mm in a first direction is within −0.5° to +0.5° based on a peak omega angle in a rocking curve measured at the center of the upper surface, and the first direction is a [1-100] direction and a direction passing through the center of the upper surface.

An off-angle selected from 0° to 15° based on a (0001) plane is applied to the silicon carbide wafer according to an embodiment, and the upper surface may be a C plane.

In one embodiment, the first peak omega angle may range from −0.3° to +0.3° based on the peak omega angle at the center.

In one embodiment, the first peak omega angle may range from −0.2° to +0.2° based on the peak omega angle at the center.

In one embodiment, the first peak omega angle ranges from −0.05° to +0.05° based on the peak omega angle at the center.

In one embodiment, a rate of change in the first peak omega angle according to a position in the first direction may be 0.1°/15 mm or less.

In one embodiment, in the target region, a second peak omega angle measured at intervals of 15 mm in a second direction may be within −0.8° to +0.8° based on the peak omega angle at the center, and the second direction is a [11-20] direction and a direction passing through the center of the upper surface.

In one embodiment, a rate of change in the second peak omega angle according to a position in the second direction is 0.5°/15 mm or less.

In one embodiment, the rate of change in the first peak omega angle may be smaller than the rate of change in the second peak omega angle.

In one embodiment, the rate of change in the first peak omega angle may be $2/3$ times or less the rate of change in the second peak omega angle.

In one embodiment, the lower surface includes a second target region, the second target region being within 85% of a radius of the lower surface based on a center of the lower surface, wherein, in the second target region, a third peak omega angle in a rocking curve measured at intervals of 15 mm in a third direction is within −0.5° to +0.5° based on a peak omega angle in a rocking curve measured at the center of the lower surface, and the third direction is a [1-100] direction and a direction passing through the center of the lower surface.

An off-angle selected from 0° to 15° based on a (0001) plane is applied to the silicon carbide wafer according to an embodiment, and the lower surface may be a Si plane.

In accordance with another aspect of the present invention, provided is a method of manufacturing a silicon carbide wafer, including: manufacturing a silicon carbide ingot; slicing the silicon carbide ingot; and polishing the sliced upper surface and lower surface, wherein the polished upper surface includes a first target region, the first target region being within 85% of a radius of the upper surface based on a center of the upper surface, and in the first target region, a first peak omega angle in a rocking curve measured at intervals of 15 mm in a first direction is within −0.5° to +0.5° based on a peak omega angle in a rocking curve measured at the center of the upper surface, and the first direction is a [1-100] direction and a direction passing through the center of the upper surface.

In one embodiment, the manufacturing of the silicon carbide ingot includes: preparing a holder having thermally conductive anisotropy; attaching a seed crystal to the holder; and depositing silicon carbide on the seed crystal. In the attachment of the seed crystal to the holder, the seed crystal may be attached to the holder so that a direction in which thermal conductivity is 100 W/mK or more, among directions horizontally passing through a center of the holder, and a [1-100] direction of the seed crystal correspond to each other.

Advantageous Effects

A silicon carbide wafer according to an embodiment has a small deviation of a first peak omega angle in a first direction. Accordingly, the silicon carbide wafer according to an embodiment may have enhanced crystal characteristics along the first direction. Therefore, the silicon carbide wafer according to an embodiment may enhanced mechanical properties with respect to the first direction. That is, the silicon carbide wafer according to an embodiment supplements mechanical properties with respect to the first direction that may be relatively weak, thus having overall enhanced mechanical properties.

In particular, since the silicon carbide wafer according to an embodiment has enhanced crystal characteristics with respect to the first direction, even when the wafer is bent in a bending axis crossing the first direction, the wafer may have improved mechanical properties.

In particular, various defects such as basal plane dislocation (BPD) may have a shape extending in a direction crossing the first direction. In this case, since the silicon carbide wafer according to an embodiment has a small deviation of the first peak omega angle, deterioration of mechanical properties due to defects such as the basal plane dislocation can be minimized. For example, the deviation of the first peak omega angle is designed to be small, and thus, the occurrence of cracking of the silicon carbide wafer according to an embodiment in a direction crossing the first direction, by defects such as the basal plane dislocation, can be minimized.

Accordingly, cracking of the silicon carbide wafer according to an embodiment caused by external impact or stress may be reduced.

In addition, the silicon carbide wafer according to an embodiment is designed such that the deviation of the first peak omega angle is small, and thus has an improved crystal structure and the number of defects therein may be reduced. That is, when the silicon carbide wafer is manufactured, a holder having relatively high thermal conductivity in the first direction is applied. Accordingly, when silicon carbide is deposited on the seed crystal, the holder is uniformly applied in the first direction. Thus, defects having a shape extending in a direction crossing the first direction may be effectively suppressed.

In addition, since the carbon silicon wafer according to an embodiment has uniform crystal characteristics in the first direction, warping in a direction crossing the first direction, as a bending axis may be minimized.

Consequently, the crystal characteristics of the silicon carbide wafer according to an embodiment in a direction in which mechanical properties may be weak may be maximized by minimizing the deviation of the first peak omega angle, with respect to the first direction. Accordingly, the silicon carbide wafer according to an embodiment is overall uniform, has strong mechanical properties, and the warping, defects, and cracking due to impact thereof may be effectively prevented.

BEST MODE

Description of Symbols

Hereinafter, embodiments of the present invention will be described in detail in such a manner that the invention may be easily carried out by those of ordinary skill in the art to which the present disclosure pertains. The present invention may, however, be embodied in many different forms and should not be construed as being limited to the embodiments set forth herein.

In the present specification, when a component is referred to as "including" another component, unless otherwise specifically stated, this does not preclude other components and also may mean that other components may be further included.

In the present specification, when a component is referred to as being "connected" with another component, it includes not only a case where it is directly connected, but also a case where it is connected with another component present therebetween.

In the present specification, it will be understood that when B is referred to as being "on" A, B is directly on A or B is on A with an intervening layer disposed therebetween, and it should not be construed as being limited to the case in which B is directly on a surface of A.

In the present specification, the term such as "combination(s) thereof" included in an expression of the Markush form means a mixture or combination of one or more elements selected from the group consisting of elements described in the expression of the Markush form and includes one or more elements selected from the group consisting of the elements.

In the present specification, "A and/or B" means "A, B, or A and B."

An expression used in the singular is interpreted to include an expression in the singular or in the plural unless the context clearly indicates otherwise.

Figure 1:
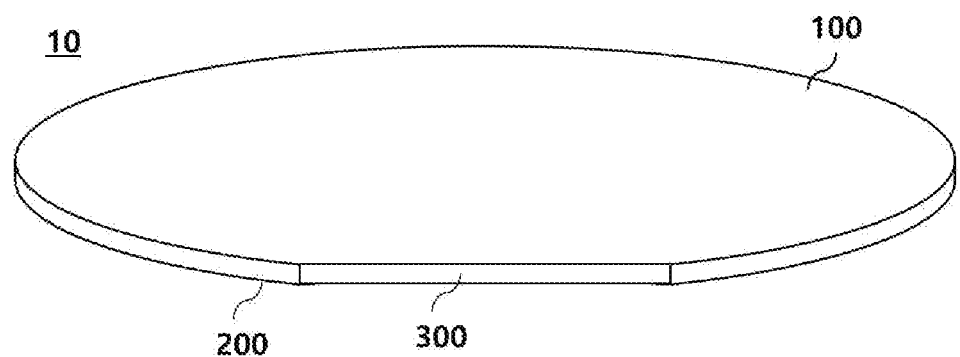
FIG. 1 is a perspective view illustrating a silicon carbide wafer according to an embodiment.
Figure 2:
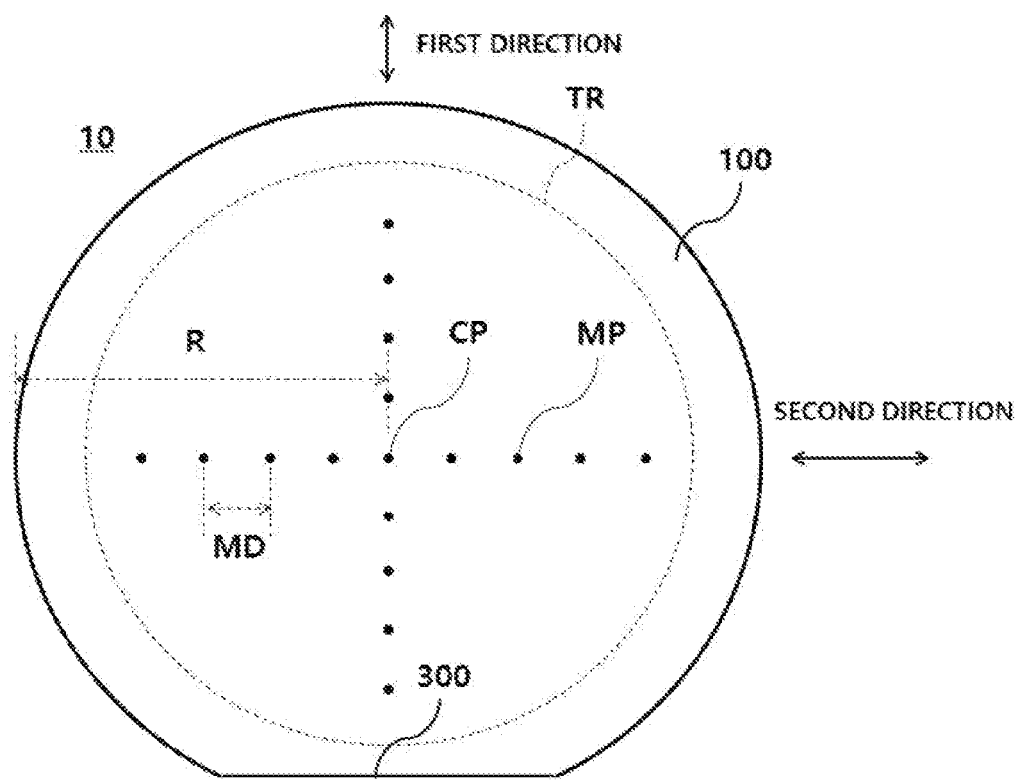
FIG. 2 is a plan view illustrating the upper surface of a silicon carbide wafer according to an embodiment.
Figure 3:
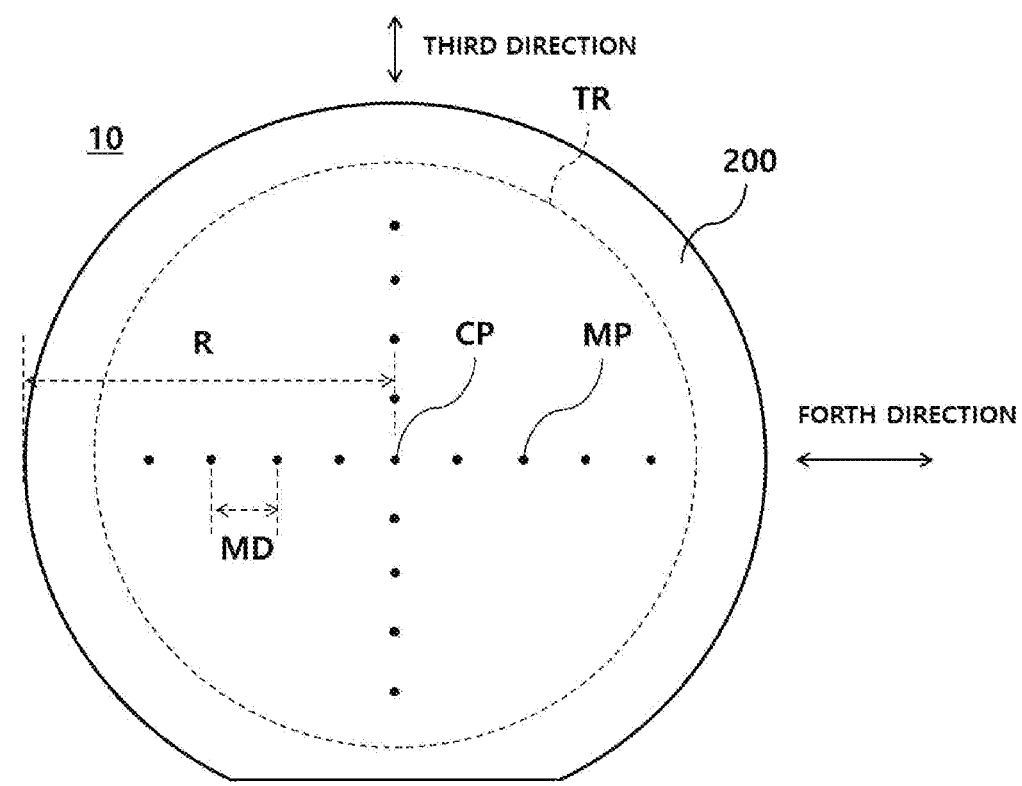
FIG. 3 is a plan view illustrating the lower surface of a silicon carbide wafer according to an embodiment.
Figure 4:
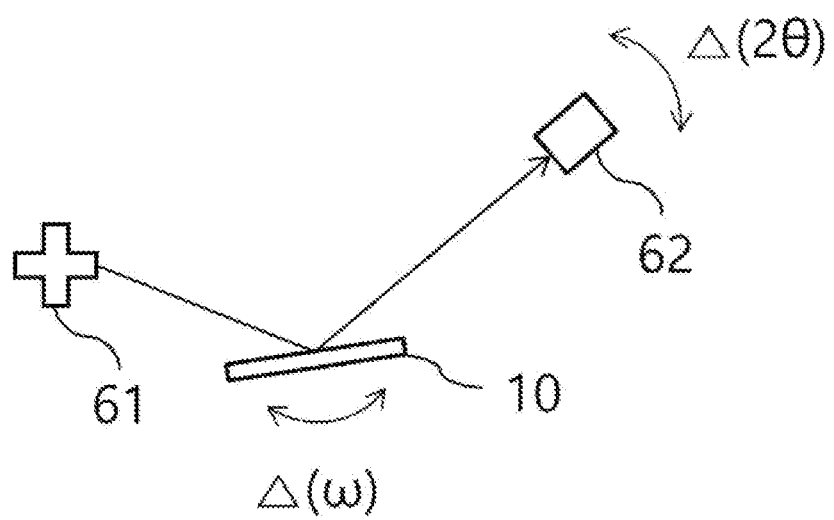
FIG. 4 is a view illustrating a process of measuring a rocking curve.
Figure 5:
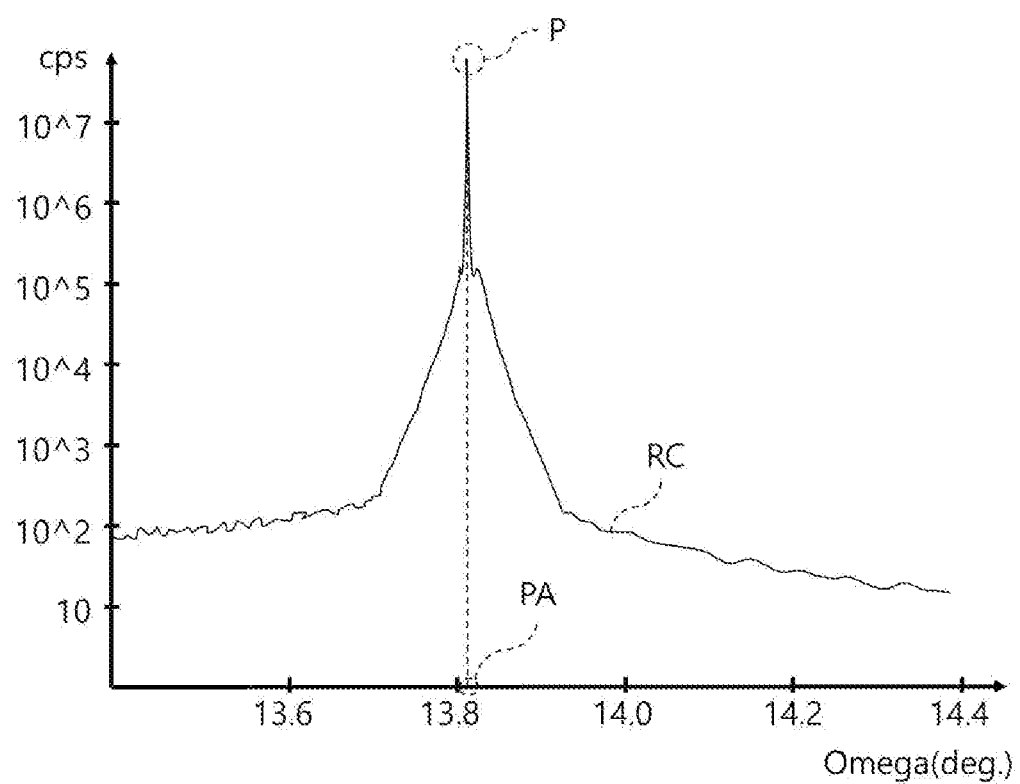
FIG. 5 is a graph showing an example of a rocking curve.
Figure 6:
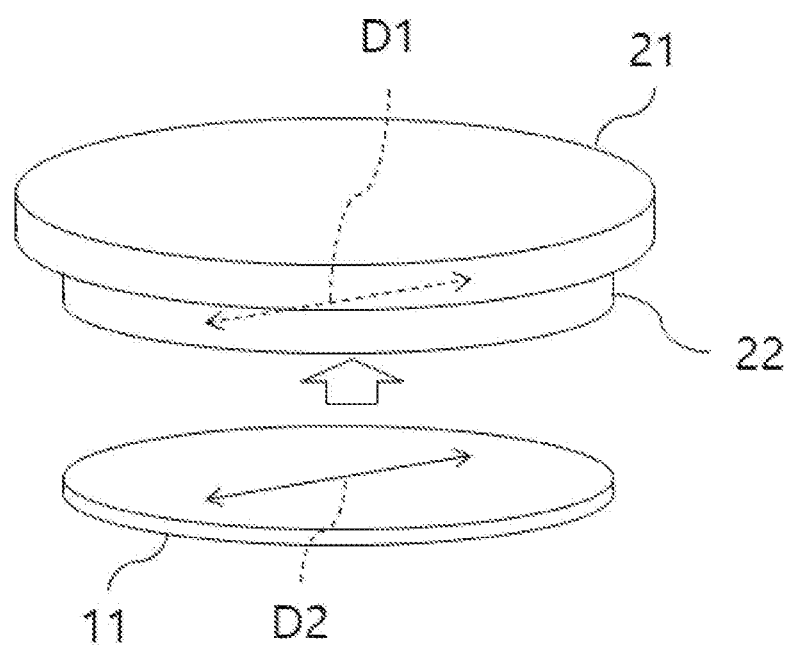
FIG. 6 is a view illustrating a process of attaching a seed drop to a seed crystal holder.
Figure 7:
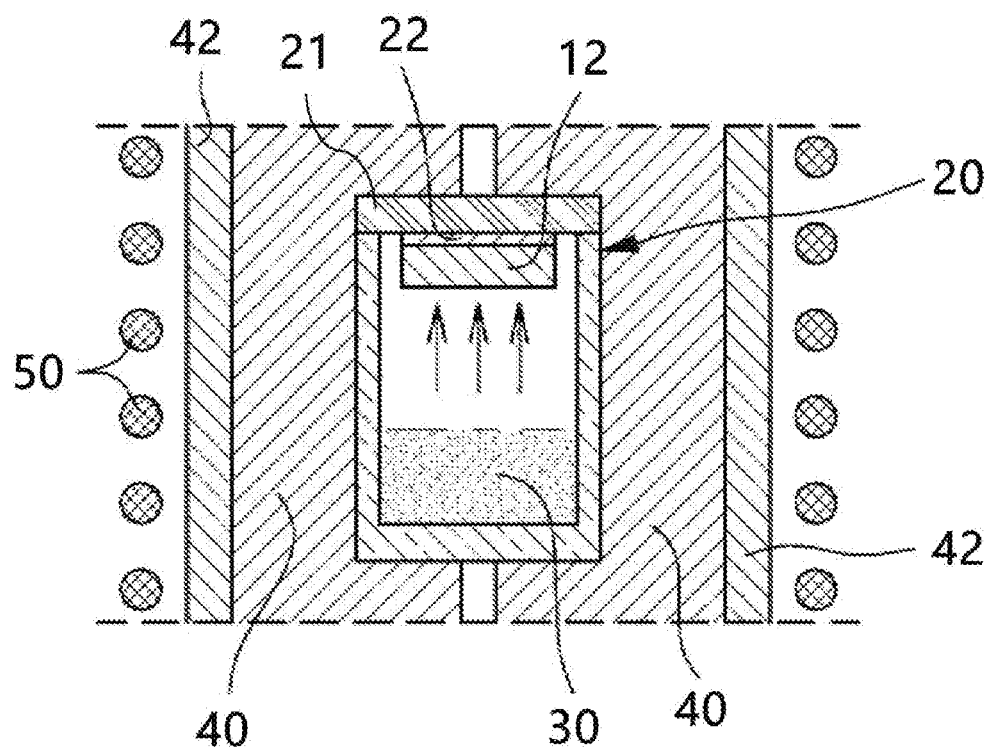
FIG. 7 is a view illustrating a process of manufacturing a silicon carbide ingot.

FIG. 1 is a perspective view illustrating a silicon carbide wafer according to an embodiment. FIG. 2 is a plan view illustrating the upper surface of a silicon carbide wafer according to an embodiment. FIG. 3 is a plan view illustrating the lower surface of a silicon carbide wafer according to an embodiment. FIG. 4 is a view illustrating a process of measuring a rocking curve. FIG. 5 is a graph showing an example of a rocking curve. FIG. 6 is a view illustrating a process of attaching a seed drop to a seed crystal holder. FIG. 7 is a view illustrating a process of manufacturing a silicon carbide ingot.

As illustrated in FIGS. 1 to 3, a silicon carbide wafer 10 according to an embodiment includes an upper surface 100 and a lower surface 200. The upper surface 100 and the lower surface 200 face each other. The upper surface 100 and the lower surface 200 may be substantially parallel to each other.

The silicon carbide wafer according to an embodiment may be a wafer to which an off-angle selected from 0° to 15° based on a (0001) plane is applied. The silicon carbide wafer according to an embodiment may be a wafer to which an off-angle selected from 1° to 11° based on a (0001) plane is applied. The silicon carbide wafer according to an embodiment may be a wafer to which an off-angle selected from 3° to 5° based on a (0001) plane is applied. The silicon carbide wafer according to an embodiment may be a wafer to which an off-angle of 4° based a (0001) plane is applied.

In this regard, the off-angle may be an angle between a normal of the (0001) plane and a normal of the upper surface.

As illustrated in FIGS. 1 to 3, the silicon carbide wafer according to an embodiment further includes a chamfer portion 300. The chamfer portion 300 is a portion obtained by linearly processing a portion of an edge of the silicon carbide wafer.

As illustrated in FIGS. 2 and 3, each of the upper surface 100 and the lower surface 200 includes a target region TR. The target region TR is a region from the central point CP of the silicon carbide wafer 10 according to an embodiment to within 85% of the radius R of the silicon carbide wafer 10 in the outward direction.

As illustrated in FIG. 2, the upper surface 100 includes a first direction and a second direction.

The first direction is a [1-100] direction and a direction passing through the central point CP of the upper surface 100. The first direction may be a direction passing through the central point CP of the upper surface 100 among directions perpendicular to a straight line where the (1-100) plane and the upper surface 100 meet. That is, the first direction may be a direction in which a line provided on the upper surface 100 and passing through the central point CP of the upper surface 100, among lines perpendicular to a line where the upper surface 100 and the [1-100] plane cross each other, extends.

The second direction is a [11-20] direction and a direction passing through the central point CP of the upper surface 100. The second direction is a direction passing through the central point CP of the upper surface 100 among directions perpendicular to a line where the upper surface 100 and the (11-20) plane cross each other. That is, the second direction may be a direction in which a line provided on the upper surface 100 and passing through the central point CP of the upper surface 100, among lines perpendicular to a line where the upper surface 100 and the (11-20) plane cross each other, extends.

The first direction and the second direction may be substantially perpendicular to each other. That is, an angle between the first direction and the second direction may be about 90°.

As illustrated in FIG. 3, the lower surface 200 includes a third direction and a fourth direction.

The third direction is a [1-100] direction and a direction passing through the central point CP of the lower surface 200. The third direction may be a direction passing through the central point CP of the lower surface 200 among directions perpendicular to a straight line where the (1-100) plane and the lower surface 200 meet. That is, the third direction may be a direction in which a line provided on the lower surface 200 and passing through the central point CP of the lower surface 200, among lines perpendicular to a line where the lower surface 200 and the (1-100) plane cross each other, extends.

The fourth direction is a [11-20] direction and a direction passing through the central point CP of the lower surface 200. The fourth direction is a direction passing through the central point CP of the lower surface 200 among directions perpendicular to a line where the lower surface 200 and the (11-20) plane cross each other. That is, the fourth direction may be a direction in which a line provided on the lower surface 200 and passing through the central point CP of the lower surface 200, among lines perpendicular to a line where the lower surface 200 and the (11-20) plane cross each other, extends.

The third direction and the fourth direction may be substantially perpendicular to each other. That is, an angle between the third direction and the fourth direction may be about 90°.

Also, the first direction and the third direction may be substantially parallel to each other. The second direction and the fourth direction may be substantially parallel to each other.

In addition, the chamfer portion 300 may be substantially parallel to the second direction and the fourth direction. The chamfer portion 300 may be formed based on a plane direction of the (1-100) plane. That is, the chamfer portion 300 may be formed by being processed to extend in the plane direction of the (1-100) plane.

The central point CP of the silicon carbide wafer 10, the upper surface 100, and the lower surface 200 may mean a geometric center of the wafer in which the chamfer portion 300 is not formed. That is, when the outer circumference of a virtual circle substantially coincides with the edge of the wafer excluding the chamfer portion 300, a portion corresponding to the center of the virtual circle is the central point CP of the wafer 10, the upper surface 100, and the lower surface 200.

In addition, the radius R of the wafer may be a linear distance from the central point CP of the wafer to the remaining edge excluding the chamfer portion 300. In addition, the target region TR may have a circular shape, and may have a radius that is 85% of the radius R of the wafer 10. In addition, the center of the target region TR substantially coincides with the center of the wafer 10.

The upper surface 100 may be a C plane, and the lower surface 200 may be a Si plane.

The following peak omega angle may be measured by the following method.

First, the C plane and the Si plane of the silicon carbide wafer according to an embodiment are specified, and the center thereof is specified. Subsequently, according to each crystal plane, the first direction, the second direction, the third direction, and the fourth direction are specified. Then, measuring points MP are specified at regular intervals MD along the first direction, the second direction, the third direction, and the fourth direction.

Then, the central point CP of the upper surface and the lower surface and measuring points MP of each surface are analyzed by X-ray diffraction analysis, a rocking curve of each measuring point is derived, and an omega angle corresponding to the maximum peak of the rocking curve is defined as the peak omega angle.

As illustrated in FIG. 4, a high-resolution X-ray diffraction analysis system (HR-XRD system) may be applied as the X-ray diffraction analysis. In addition, in the X-ray diffraction analysis, an X-ray path is aligned in the [11-20] direction of the wafer 10, an angle between an X-ray source optic 61 and an X-ray detector optic 62 is set to 2θ (35° to 36°), and the omega (ω, or theta θ, X-ray detector optic) angle is adjusted according to the off-angle of the wafer 10, to measure a rocking curve.

In addition, when the off-angle is an X degree, it means having an off-angle evaluated as an X degree within a generally acceptable error range, and may include, for example, an off-angle ranging from (X−005 degrees) to (X+005 degrees).

In addition, as illustrated in FIG. 5, a rocking curve RC measured at the central point CP and each measuring point MP may have a maximum peak P, and an omega angle corresponding to the maximum peak P is the peak omega angle PA.

A first peak omega angle may be measured in the target region of the upper surface. The first peak omega angle may be measured at each measuring point with regular intervals along the first direction. For example, the first peak omega angle may be measured at an interval selected from about 1 mm to about 20 mm, along the first direction. The first peak omega angle may be measured at an interval selected from about 1 mm, about 3 mm, about 5 mm, about 10 mm, about 15 mm, or about 20 mm, along the first direction. The first peak omega angle may be measured at intervals of about 15 mm, along the first direction.

The first peak omega angle may be within about −0.5° to about +0.5° based on the peak omega angle measured at the center of the upper surface.

That is, the first peak omega angle may satisfy Expression 1 below:

$$\Omega c1 - 0.5° < \Omega 1 < \Omega c1 + 0.5°$$ [Expression 1]

wherein $\Omega 1$ is a first peak omega angle, and $\Omega c1$ is a peak omega angle at the center of the upper surface.

The first peak omega angle may be within about −0.3° to about +0.3° based on the peak omega angle measured at the center of the upper surface. The first peak omega angle may be within about −0.2° to about +0.2° based on the peak omega angle measured at the center of the upper surface. The first peak omega angle may be within about −0.1° to about +0.1° based on the peak omega angle measured at the center of the upper surface. The first peak omega angle may be within about −0.05° to about +0.05° based on the peak omega angle measured at the center of the upper surface. The first peak omega angle may be within about −0.03° to about +0.03° based on the peak omega angle measured at the center of the upper surface. The first peak omega angle may be within about −0.02° to about +0.02° based on the peak omega angle measured at the center of the upper surface.

Since the first peak omega angle has the above ranges, the silicon carbide wafer according to an embodiment may have enhanced mechanical properties and the like with respect to the first direction, and may have enhanced crystal characteristics. Accordingly, overall cracking of the silicon carbide wafer according to an embodiment may be prevented, and defects therein may be reduced.

In particular, the crystal characteristics of the silicon carbide wafer according to an embodiment in a direction in which mechanical properties may be weak may be maximized by minimizing the deviation of the first peak omega angle, with respect to the first direction. Accordingly, the silicon carbide wafer according to an embodiment is overall uniform, has strong mechanical properties, and the warping, defects, and cracking due to impact thereof may be effectively prevented.

Also, a second peak omega angle may be measured in the target region of the upper surface. The second peak omega angle may be measured at each measuring point with regular intervals along the second direction. For example, the second peak omega angle may be measured at an interval selected from about 1 mm to about 20 mm along the second direction. The second peak omega angle may be measured at an interval selected from about 1 mm, about 3 mm, about 5 mm, about 10 mm, about 15 mm, or about 20 mm along the second direction. The second peak omega angle may be measured at intervals of about 15 mm along the second direction.

The second peak omega angle may be within about −0.8° to about +0.8° based on the peak omega angle measured at the center of the upper surface.

That is, the second peak omega angle may satisfy Expression 2 below:

$$\Omega c1 - 0.8° < \Omega 2 < \Omega c1 + 0.8°$$ [Expression 2]

wherein $\Omega 2$ is a second peak omega angle, and $\Omega c1$ is a peak omega angle at the center of the upper surface.

The second peak omega angle may be within about −0.5° to about +0.5° based on the peak omega angle measured at the center of the upper surface. The second peak omega angle may be within about −0.3° to about +0.3° based on the peak omega angle measured at the center of the upper surface. The second peak omega angle may be within about −0.1° to about +0.1° based on the peak omega angle measured at the center of the upper surface. The second peak omega angle may be within about −0.07° to about +0.07° based on the peak omega angle measured at the center of the upper surface. The second peak omega angle may be within about −0.05° to about +0.05° based on the peak omega angle measured at the center of the upper surface.

Since the second peak omega angle has the above ranges, the silicon carbide wafer according to an embodiment may have enhanced mechanical properties and the like with respect to the second direction, and may have enhanced crystal characteristics. Accordingly, overall cracking of the silicon carbide wafer according to an embodiment may be prevented, and defects therein may be reduced.

A rate of change in the first peak omega angle according to a position in the first direction may be 0.5°/10 mm or less. The rate of change in the first peak omega angle may be an average of the rates of change in the first peak omega angle at each measuring point, represented by Expression 3 below:

$$|\Omega n - \Omega n - 1|/MD$$ [Expression 3]

wherein $\Omega n$ is a peak omega angle at the current measuring point, $\Omega n-1$ is a peak omega angle at the previous measuring point, MD is a distance from the previous measuring point to the current measuring point, unit is 15 mm, and the measurement of the peak omega angle is considered to be sequentially carried out from one end to the other end with respect to the first direction. That is, the rate of change in the first peak omega angle at each measuring point is a value obtained by dividing a difference between peak omega angles at neighboring measuring points by the interval.

The rate of change in the first peak omega angle according to a position in the first direction may be 0.4°/15 mm or less. The rate of change in the first peak omega angle according to a position in the first direction may be 0.3°/15 mm or less. The rate of change in the first peak omega angle according to a position in the first direction may be 0.2°/15 mm or less. The rate of change in the first peak omega angle according to a position in the first direction may be 0.1°/15 mm or less. The rate of change in the first peak omega angle according to a position in the first direction may be 0.05°/15 mm or less. A minimum value of the rate of change in the first peak omega angle according to a position in the first direction may be 0°/15 mm.

A rate of change in the second peak omega angle according to a position in the second direction may be 0.8°/15 mm or less. The rate of change in the second peak omega angle may be an average of the rates of change in the second peak omega angle at each measuring point, represented by Expression 4 below:

$$|\Omega n - \Omega n-1|/MD \qquad \text{[Expression 4]}$$

wherein $\Omega n$ is a peak omega angle at the current measuring point, $\Omega n-1$ is a peak omega angle at the previous measuring point, MD is a distance from the previous measuring point to the current measuring point, unit is 10 mm, and the measurement of the peak omega angle is considered to be sequentially carried out from one end to the other end with respect to the second direction. That is, the rate of change in the second peak omega angle at each measuring point is a value obtained by dividing a difference between peak omega angles at neighboring measuring points by the interval.

The rate of change in the second peak omega angle according to a position in the second direction may be 0.5°/15 mm or less. The rate of change in the second peak omega angle according to a position in the second direction may be 0.3°/15 mm or less. The rate of change in the second peak omega angle according to a position in the second direction may be 0.2°/15 mm or less. The rate of change in the second peak omega angle according to a position in the second direction may be 0.1°/15 mm or less. A minimum value of the rate of change in the second peak omega angle according to a position in the second direction may be 0°/15 mm.

Since the rate of change in the first peak omega angle and the rate of change in the second peak omega angle are low as in the above ranges, the silicon carbide wafer according to an embodiment has an overall small change in crystal structure according to the position. Accordingly, the silicon carbide wafer according to an embodiment may have an improved crystal structure with respect to the first direction and the second direction, and may have a low stress.

In addition, the rate of change in the first peak omega angle may be smaller than the rate of change in the second peak omega angle. The rate of change in the first peak omega angle may be about ⅔ times the rate of change in the second peak omega angle. The rate of change in the first peak omega angle may be about ½ times smaller than the rate of change in the second peak omega angle. The rate of change in the first peak omega angle may be about ⅓ times smaller than the rate of change in the second peak omega angle. The rate of change in the first peak omega angle may be about ¹⁄₂₀₀ times to about ⅔ times the rate of change in the second peak omega angle.

Since the rate of change in the first peak omega angle is smaller than the rate of change in the second peak omega angle, the silicon carbide wafer according to an embodiment may exhibit further reinforced mechanical strength and crystal characteristics with respect to the first direction. Accordingly, overall cracking and the like of the silicon carbide wafer according to an embodiment may be prevented by further reinforcing a direction in which mechanical strength and crystal characteristics can be relatively deteriorated. In addition, the silicon carbide wafer according to an embodiment may have equally enhanced mechanical strength and crystal characteristics with respect to both the first direction and the second direction.

A third peak omega angle may be measured in the target region of the lower surface. The third peak omega angle may be measured at each measuring point with regular intervals along the third direction. For example, the third peak omega angle may be measured at an interval selected from about 1 mm to about 20 mm along the third direction. The third peak omega angle may be measured at an interval selected from about 1 mm, about 3 mm, about 5 mm, about 10 mm, about 15 mm, or about 20 mm along the third direction. The third peak omega angle may be measured at intervals of about 15 mm along the third direction.

The third peak omega angle may be within about −0.5° to about +0.5° based on the peak omega angle measured at the center of the upper surface.

That is, the third peak omega angle may satisfy Expression 5 below:

$$\Omega c2 - 0.5° < \Omega 3 < \Omega c2 + 0.5° \qquad \text{[Expression 5]}$$

wherein $\Omega 3$ is the third peak omega angle, and $\Omega c2$ is a peak omega angle measured at the center of the lower surface.

The third peak omega angle may be within about −0.3° to about +0.3° based on the peak omega angle measured at the center of the upper surface. The third peak omega angle may be within about −0.2° to about +0.2° based on the peak omega angle measured at the center of the upper surface. The third peak omega angle may be within about −0.1° to about +0.1° based on the peak omega angle measured at the center of the upper surface. The third peak omega angle may be within about −0.05° to about +0.05° based on the peak omega angle measured at the center of the upper surface. The third peak omega angle may be within about −0.03° to about +0.03° based on the peak omega angle measured at the center of the upper surface.

Since the third peak omega angle has the above ranges, the silicon carbide wafer according to an embodiment may have enhanced mechanical properties and the like with respect to the third direction, and may have enhanced crystal characteristics. Accordingly, overall cracking of the silicon carbide wafer according to an embodiment may be prevented, defects therein may be reduced.

Also, a fourth peak omega angle may be measured in the target region of the upper surface. The fourth peak omega angle may be measured at each measuring point with regular intervals along the fourth direction. For example, the fourth peak omega angle may be measured at an interval selected from about 1 mm to about 20 mm along the fourth direction. The fourth peak omega angle may be measured at an interval selected from about 1 mm, about 3 mm, about 5 mm, about 10 mm, about 15 mm, or about 20 mm along the fourth direction. The fourth peak omega angle may be measured at intervals of about 15 mm along the fourth direction.

The fourth peak omega angle may be within about −0.8° to about +0.8° based on the peak omega angle measured at the center of the upper surface.

That is, the fourth peak omega angle may satisfy Expression 6 below:

$$\Omega c2 - 0.8° < \Omega 4 < \Omega c2 + 0.8° \qquad \text{[Expression 6]}$$

wherein $\Omega 4$ is the fourth peak omega angle.

The fourth peak omega angle may be within about −0.5° to about +0.5° based on the peak omega angle measured at the center of the upper surface. The fourth peak omega angle may be within about −0.3° to about +0.3° based on the peak omega angle measured at the center of the upper surface. The fourth peak omega angle may be within about −0.1° to about +0.1° based on the peak omega angle measured at the center of the upper surface. The fourth peak omega angle may be within about −0.05° to about +0.05° based on the peak omega angle measured at the center of the upper surface.

Since the fourth peak omega angle has the above ranges, the silicon carbide wafer according to an embodiment may have enhanced mechanical properties and the like with respect to the fourth direction, and may have enhanced crystal characteristics. Accordingly, overall cracking of the silicon carbide wafer according to an embodiment may be prevented, and defects therein may be reduced.

A rate of change in the third peak omega angle according to a position in the third direction may be 0.5°/15 mm or less. The rate of change in the third peak omega angle may be an average of the rates of change at each measuring point, represented by Expression 7 below:

$$|\Omega n - \Omega n-1|/MD \quad \text{[Expression 7]}$$

wherein $\Omega n$ is a peak omega angle at the current measuring point, $\Omega n-1$ is a peak omega angle at the previous measuring point, MD is a distance from the previous measuring point to the current measuring point, unit is 15 mm, and the measurement of the peak omega angle is considered to be sequentially carried out from one end to the other end with respect to the third direction. That is, the rate of change at each measuring point is a value obtained by dividing a difference between peak omega angles at neighboring measuring points by the interval.

The rate of change in the third peak omega angle according to a position in the third direction may be 0.4°/15 mm or less. The rate of change in the third peak omega angle according to a position in the third direction may be 0.3°/15 mm or less. The rate of change in the third peak omega angle according to a position in the third direction may be 0.2°/15 mm or less. The rate of change in the third peak omega angle according to a position in the third direction may be 0.1°/15 mm or less. A minimum value of the rate of change in the third peak omega angle according to a position in the third direction may be 0°/15 mm.

A rate of change in the fourth peak omega angle according to a position in the fourth direction may be 0.8°/15 mm or less. The rate of change in the fourth peak omega angle may be an average of the rates of change at each measuring point, represented by Expression 8 below:

$$|\Omega n - \Omega n-1|/MD \quad \text{[Expression 8]}$$

wherein $\Omega n$ is a peak omega angle at the current measuring point, $\Omega n-1$ is a peak omega angle at the previous measuring point, MD is a distance from the previous measuring point to the current measuring point, unit is 15 mm, and the measurement of the peak omega angle is considered to be sequentially carried out from one end to the other end with respect to the fourth direction. That is, the rate of change at each measuring point is a value obtained by dividing a difference between peak omega angles at neighboring measuring points by the interval.

The rate of change in the fourth peak omega angle according to a position in the fourth direction may be 0.5°/10 mm or less. The rate of change in the fourth peak omega angle according to a position in the fourth direction may be 0.3°/10 mm or less. The rate of change in the fourth peak omega angle according to a position in the fourth direction may be 0.2°/10 mm or less. The rate of change in the fourth peak omega angle according to a position in the fourth direction may be 0.1°/10 mm or less. A minimum value of the rate of change in the fourth peak omega angle according to a position in the fourth direction may be 0°/15 mm.

Since the rate of change in the third peak omega angle and the rate of change in the fourth peak omega angle are low as in the above ranges, the silicon carbide wafer according to an embodiment has a small change in crystal structure according to the position. Accordingly, the silicon carbide wafer according to an embodiment may have an improved crystal structure with respect to the third and fourth directions, and may have a low stress.

The silicon carbide wafer according to an embodiment has a small deviation of the first peak omega angle in the first direction. Accordingly, the silicon carbide wafer according to an embodiment may have enhanced crystal characteristics with respect to the first direction. Therefore, the silicon carbide wafer according to an embodiment may enhanced mechanical properties and the like with respect to the first direction.

For example, since the silicon carbide wafer according to an embodiment has enhanced crystal characteristics with respect to the first direction, even when the wafer is bent in a bending axis crossing the first direction, the wafer may have improved mechanical properties.

In particular, various defects such as basal plane dislocation (BPD) may have a shape extending in a direction crossing the first direction. In this case, since the silicon carbide wafer according to an embodiment has a small deviation of the first peak omega angle, deterioration of mechanical properties due to defects such as the basal plane dislocation can be minimized. For example, the deviation of the first peak omega angle is designed to be small, and thus, the occurrence of cracking of the silicon carbide wafer according to an embodiment in a direction crossing the first direction, by defects such as the basal plane dislocation, can be minimized.

Accordingly, cracking of the silicon carbide wafer according to an embodiment caused by external impact or stress may be reduced.

In addition, the silicon carbide wafer according to an embodiment is designed such that the deviation of the first peak omega angle is small, and thus has an improved crystal structure and the number of defects therein may be reduced. That is, when the silicon carbide wafer is manufactured, a holder having relatively high thermal conductivity in the first direction is applied. Accordingly, when silicon carbide is deposited on the seed crystal, the holder is uniformly applied in the first direction. Thus, defects having a shape extending in a direction crossing the first direction may be effectively suppressed.

In addition, since the carbon silicon wafer according to an embodiment has uniform crystal characteristics in the first direction, warping in a direction crossing the first direction, as a bending axis may be minimized.

The silicon carbide wafer according to an embodiment supplements the crystal structure in the first direction in which crystal characteristics and mechanical properties may be relatively weak, thereby realizing overall improved rigidity and cracking prevention.

Silicon carbide according to an embodiment may be designed by various methods so as to have an improved crystal structure with respect to the first direction.

Consequently, the crystal characteristics of the silicon carbide wafer according to an embodiment in a direction in which mechanical properties may be weak may be maximized by minimizing the deviation of the first peak omega angle, with respect to the first direction. Accordingly, the silicon carbide wafer according to an embodiment is overall uniform, has strong mechanical properties, and the warping, defects, and cracking due to impact thereof may be effectively prevented.

Referring to FIGS. 6 and 7, the silicon carbide wafer according to an embodiment may be manufactured as follows.

First, a silicon carbide ingot may be manufactured. The silicon carbide ingot is manufactured by applying a physical vapor transport (PVT) method so as to have a large area and fewer defects.

A method of manufacturing a silicon carbide ingot 12, according to an embodiment, may include a preparation step, a raw material loading step, and a growth step.

The preparation step is a step of preparing a crucible assembly including a crucible body 20 having an inner space and a crucible cover 21 for covering the crucible body.

The raw material loading step is a step of loading a raw material 30 into the crucible assembly and placing seed crystals on the raw material at regular intervals from the raw material.

The crucible body 20 may have, for example, a structure that has a cylindrical shape having an upper opening and enables a silicon carbide raw material to be loaded into the inside thereof. The crucible body 20 may have a density of 1.70 g/cm$^3$ to 1.90 g/cm$^3$. A material of the crucible body 20 may include graphite.

The crucible cover 21 may have a density of 1.70 g/cm$^3$ to 1.90 g/cm$^3$. A material of the crucible cover 21 may include graphite. The crucible cover 21 may have a shape that completely covers the opening of the crucible body 20.

As the crucible cover 21, a crucible cover 21 that partially covers the opening of the crucible body 20 or includes a through-hole (not shown) may be applied. In this case, the speed of vapor transport in a crystal growth atmosphere, which will be described below, may be controlled.

In addition, a seed crystal holder 22 is provided on the crucible cover 21. The seed crystal holder 22 may be coupled to the crucible cover 21. The seed crystal holder 22 may be attached to the crucible cover 21. The seed crystal holder 22 may be integrally formed with the crucible cover 21.

The crucible cover 21 may have a thickness of about 10 mm to about 50 mm. In addition, the seed crystal holder 22 may have a thickness of about 1 mm to about 10 mm.

To manufacture the silicon carbide ingot, a seed crystal is prepared. The seed crystal may be any one of wafers to which an off-angle, which is an angle selected from 0° to 8° with respect to the (0001) plane, is applied.

The seed crystal may be a 4H SiC ingot, which is substantially a single crystal whose defects and polymorphic mixing are minimized. The silicon carbide seed crystal may be made of 4H SiC.

The seed crystal may have a diameter of 4 inches or more, 5 inches or more, and further 6 inches or more. More particularly, the seed crystal may have a diameter of 4 inches to 12 inches, 4 inches to 10 inches, or 6 inches to 8 inches.

The seed crystal is adhered to the seed crystal holder. The seed crystal holder includes graphite. The seed crystal holder may be made of graphite. The seed crystal holder may include anisotropic graphite. More specifically, the seed crystal holder may be made of anisotropic graphite.

The seed crystal holder may have high thermal conductivity. The seed crystal holder may have high thermal conductivity in a horizontal direction. The seed crystal holder may have a thermal conductivity of about 100 W/mK or more in at least one direction. The seed crystal holder may have a thermal conductivity of about 110 W/mK or more in at least one direction. The seed crystal holder may have a thermal conductivity of about 120 W/mK or more in at least one direction. The seed crystal holder may have a thermal conductivity of about 130 W/mK or more in at least one direction. The seed crystal holder may have a thermal conductivity of about 140 W/mK or more in at least one direction. The seed crystal holder may have a thermal conductivity of about 150 W/mK or more in at least one direction.

As illustrated in FIG. 6, when the seed crystal 11 is adhered to the seed crystal holder 22, the seed crystal 11 may be aligned with the seed crystal holder 22 and adhered thereto. The [1-100] direction (D2) of the seed crystal 11 may be parallel to a direction D1 having the highest thermal conductivity, among horizontal directions of the seed crystal holder 22. A first direction D2 of the seed crystal 11 may coincide with a direction D1 having the highest thermal conductivity, among horizontal directions of the seed crystal holder 22.

The seed crystal and the seed crystal holder may be adhered to each other so that the first direction of the seed crystal coincides with a direction having a thermal conductivity of about 100 W/mK or more, among horizontal directions of the seed crystal holder. The seed crystal and the seed crystal holder may be adhered to each other so that the first direction of the seed crystal coincides with a direction having a thermal conductivity of about 110 W/mK or more, among horizontal directions of the seed crystal holder.

In addition, the crucible cover 21 and the seed crystal holder 22 may be integrally formed with each other. In addition, the crucible cover 21 and the seed crystal holder 22 may be formed of graphite. In this case, the crucible cover 21 and the seed crystal holder 22 may have a thermal conductivity of about 100 W/mK or more in at least one direction. In this case, the crucible cover 21 and the seed crystal holder 22 may have a thermal conductivity of about 110 W/mK or more in at least one direction. In addition, the crucible cover 21 and the seed crystal holder 22 may have substantially the same thermal conductivity according to the direction.

In addition, the seed crystal and the seed crystal holder may be adhered to each other so that the first direction of the seed crystal coincides with a direction having a thermal conductivity of about 100 W/mK or more, among horizontal directions of the crucible cover. The seed crystal and the seed crystal holder may be adhered to each other so that the first direction of the seed crystal coincides with a direction having a thermal conductivity of about 110 W/mK or more, among horizontal directions of the crucible cover.

In addition, in the crucible cover 21 and the seed crystal holder 22, the first direction of the seed crystal may substantially coincide with a direction having the highest thermal conductivity, among horizontal directions of the seed crystal holder 22.

In addition, the seed crystal and the seed crystal holder are adhered to each other by an adhesive layer. The adhesive layer includes a graphite filler and a carbide such as phenolic resin. The adhesive layer may have low porosity. In addition, the graphite filler may be aligned in the first direction to have relatively high thermal conductivity in the first direction.

As described above, since a direction having high thermal conductivity in the seed crystal holder coincides with the first direction of the seed crystal, when silicon carbide is grown from the seed crystal, the silicon carbide may be rigidly grown in the first direction.

The seed crystal may be disposed so that the C plane faces downward.

Subsequently, a raw material for manufacturing the silicon carbide ingot is loaded in the crucible.

The raw material 30 includes a carbon source and a silicon source. In particular, the raw material 30 may include a carbon-silicon source, or may further include a carbon source and/or a silicon source. As the carbon source, a high carbon resin (e.g., phenolic resin) or the like may be applied, and silicon particles may be applied as the silicon source, but the present invention is not limited thereto. More particularly, silicon carbide particles may be applied as the raw material.

As the raw material 30, particles having a size of 75 μm or less may be included in an amount of 15 wt % or less, 10 wt % or less, or 5 wt % or less, with respect to the total raw material. As such, when a relatively small amount of particles having a small size is applied as a raw material, the occurrence of defects in the ingot is reduced and it is also more suitable to control supersaturation, and a silicon carbide ingot capable of providing a wafer with more enhanced crystal characteristics may be manufactured.

As the raw material 30, a raw material in the form of particles having a particle diameter (D50) of 130 μm to 400 μm may be applied, and the raw material in the form of particles may be internecked or not internecked. When a raw material having such a particle diameter is applied, a silicon carbide ingot that provides a wafer having more superior crystal characteristics may be manufactured.

In the raw material loading step, the crucible assembly may have a weight ratio (Rw) of the crucible assembly to the raw material 30 of 1.5:1 to 2.7:1. In this case, the weight of the crucible assembly refers to the weight of the crucible assembly excluding the raw material. In particular, regardless of whether a seed holder is applied to the crucible assembly, the weight of the crucible assembly is a value excluding the weight of the added raw material in the assembled crucible assembly including seed crystals.

When the weight ratio is less than 1.5, the degree of supersaturation in a crystal growth atmosphere is excessively increased and the crystal quality of the ingot may be rather deteriorated. When the weight ratio exceeds 2.7, supersaturation is lowered, resulting in deteriorated crystal quality of the ingot.

The weight ratio may range from 1.6 to 2.6, and may range from 1.7 to 2.4. Within this weight ratio range, an ingot having excellent defect characteristics or crystallinity characteristics may be manufactured.

In the crucible assembly, a ratio of the length from the lowest surface where the raw material 30 is located to the surface of the seed crystal 11 to the diameter of the inner space of the crucible body 20 may be greater than 1:1 and equal to or less than 25:1.

The growth step is a step of adjusting the inner space of the crucible body 20 to a crystal growth atmosphere to vapor-transport and deposit the raw material onto the seed crystal, and arranging a silicon carbide ingot grown from the seed crystal.

The growth step includes a process of adjusting the inner space of the crucible assembly to a crystal growth atmosphere. In particular, the growth step may be carried out by wrapping the crucible assembly with a heat insulating material 40, arranging a reaction vessel (not shown) including the crucible assembly and the heat insulating material wrapped therearound, placing the reaction vessel in a reaction chamber such as a quartz tube, and then heating the crucible or the like by a heating means.

The reaction vessel is positioned in a reaction chamber 42 to induce the inner space of the crucible body 20 to a temperature suitable for the crystal growth atmosphere by a heating means 50. This temperature is one of the important factors in the crystal growth atmosphere, and a more suitable crystal growth atmosphere is formed by controlling conditions such as pressure and gas movement. The heat insulating material 40 may be positioned between the reaction chamber 42 and the reaction vessel to more easily help the formation and control of a crystal growth atmosphere.

The heat insulating material 40 may affect the temperature gradient inside the crucible body or inside the reaction vessel in the growth atmosphere. In particular, the heat insulating material may include a graphite insulating material and, more particularly, the heat insulating material may include a rayon-based graphite felt or a pitch-based graphite felt.

In an embodiment, a heat insulating material having a density of 0.12 g/cc to 0.30 g/cc may be applied. In an embodiment, a heat insulating material having a density of 0.13 g/cc to 0.25 g/cc may be applied. In an embodiment, a heat insulating material having a density of 0.14 g/cc to 0.20 g/cc may be applied.

When a heat insulating material having a density of less than 0.14 g/cc is applied, the grown ingot may have a concave shape, and 6H—SiC polymorphism may occur, resulting in deteriorated quality of the ingot.

When a heat insulating material having a density of greater than 0.30 g/cc is applied, the grown ingot may be excessively convex, and the growth rate of the edge may be lowered to decrease the yield or increase the occurrence of cracks in the ingot.

When the applied heat insulating material has a density of 0.12 g/cc to 0.30 g/cc, the quality of the ingot may be further enhanced, and the application of a heat insulating material having a density of 0.14 g/cc to 0.20 g/cc is more suitable for controlling the crystal growth atmosphere in the ingot growth process and growing an ingot having higher quality.

The heat insulating material may have a porosity of 73 vol % to 95 vol %. The heat insulating material may have a porosity of 76 vol % to 93 vol %. The heat insulating material may have a porosity of 81 vol % to 91 vol %. When the heat insulating material having such porosity is applied, the occurrence of cracks in the ingot may be further reduced.

The heat insulating material may have a compressive strength of 0.21 Mpa or more. The heat insulating material may have a compressive strength of 0.49 Mpa or more. The heat insulating material may have a compressive strength of 0.78 MPa or more. In addition, the insulating material may have a compressive strength of 3 MPa or less, and may be 25 MPa or less. When the heat insulating material has such a compressive strength, thermal/mechanical stability is excellent, and the probability of occurrence of ash is reduced, and thus, a SiC ingot with higher quality may be manufactured.

The heat insulating material may have a thickness of 20 mm or more or 30 mm or more. In addition, the heat insulating material may have a thickness of 150 mm or less, 120 mm or less, or 80 mm or less. When the thickness of the applied heat insulating material is within these ranges, the heat insulating effect may be sufficiently obtained without unnecessary waste of the heat insulating material.

The heat insulating material 40 may have a density of 0.12 g/cc to 0.30 g/cc. The heat insulating material 40 may have a porosity of 72 vol % to 90 vol %. When such a heat insulating material is applied, the growth of an ingot to have a concave or excessively convex shape may be suppressed, and deteriorated polymorphic quality or the occurrence of cracks in the ingot may be reduced.

The crystal growth atmosphere may be created through heating of the heating means 50 outside the reaction chamber 42, and may be created under a reduced pressure atmosphere and/or an inert atmosphere (e.g., an Ar atmosphere, an N2 atmosphere, or a mixed atmosphere thereof) by simultaneously or separately reducing the pressure with the heating to remove air.

The crystal growth atmosphere induces the growth of silicon carbide crystals by vapor-transporting the raw material to the surface of the seed crystal to thereby grow into an ingot 100.

In the crystal growth atmosphere, conditions of a growth temperature of 2,100° C. to 2,450° C. and a growth pressure of 1 torr to 100 torr may be applied. When such temperature and pressure are applied, a silicon carbide ingot may be more efficiently manufactured.

In particular, the crystal growth atmosphere may have conditions of a growth temperature of 2,100° C. to 2,450° C., which is the upper and lower surface temperature of a crucible, and a growth pressure of 1 torr to 50 torr. More particularly, the crystal growth atmosphere may have conditions of a growth temperature of 2,150° C. to 2,450° C., which is the upper and lower surface temperature of a crucible, and a growth pressure of 1 torr to 40 torr.

More particularly, the crystal growth atmosphere may have conditions of a growth temperature of 2,150° C. to 2,350° C., which is the upper and lower surface temperature of a crucible, and a growth pressure of 1 torr to 30 torr.

When the above-described crystal growth atmosphere is applied, it is more suitable for the manufacturing method and the like of the present invention and manufacturing a silicon carbide ingot having higher quality.

The silicon carbide ingot 12 contains 4H SiC and may have a surface with a convex or flat shape.

When the surface of the silicon carbide ingot 12 is formed to have a concave shape, other polymorphs such as 6H—SiC may be mixed in addition to the intended 4H—SiC crystal, which may deteriorate the quality of the silicon carbide ingot. In addition, when the surface of the silicon carbide ingot is formed to have an excessively convex shape, cracks may occur in the ingot itself, or crystals may be broken when processed into a wafer.

In this case, whether the silicon carbide ingot 12 is an ingot with an excessively convex shape is determined based on the degree of warpage, and the degree of warpage of the silicon carbide ingot manufactured in the present specification is 20 mm or less.

The degree of warpage is determined as a value of (the height of the center—the height of the edge) after placing a sample, in which the growth of the silicon carbide ingot has been completed, on a surface plate, and measuring heights of a center and an edge of the ingot with a height gauge based on a back surface of the ingot. A positive value for the degree of warpage means convexity, 0 means flatness, and a negative value for the degree of warpage means concavity.

In particular, the silicon carbide ingot 12 may have a surface with a convex shape or a flat shape, and may have a degree of warpage of 0 mm to 14 mm, 0 mm to 11 mm, or 0 mm to 8 mm. The silicon carbide ingot having such a degree of warpage may make wafer processing easier and reduce the occurrence of cracking.

The silicon carbide ingot 12 may be a 4H SiC ingot, which is substantially a single crystal whose defects or polymorphic mixing are minimized. The silicon carbide ingot 12 is substantially made of 4H SiC and may have a convex or flat surface.

The silicon carbide ingot 12 has a reduced number of defects that may occur in a silicon carbide ingot, and thus may provide a silicon carbide wafer having higher quality.

The silicon carbide ingot manufactured by the method of the present specification has reduced pits on the surface thereof, and in particular, pits included in the surface of an ingot having a diameter of 4 inches or more may be 10 k/cm$^2$ or less.

In the present specification, the surface pit measurement of the silicon carbide ingot is as follows: total five sites, i.e., one site of the central portion excluding a facet on the surface of the ingot, and four sites in the 3 o'clock, 6 o'clock, 9 o'clock and 12 o'clock directions located inward by about 10 mm in the direction from the edge to the central portion of the silicon carbide ingot, are observed with an optical microscope, and pits per unit area (1 cm$^2$) at each position are measured, and then the average thereof is used to evaluate pits on the surface of the ingot.

For example, the silicon carbide ingot may be subjected to external grinding of an outer edge portion of the ingot by using external grinding equipment, slicing to a certain thickness, and then processing such as edge grinding, surface polishing, and polishing.

The slicing step is a step of arranging sliced crystals by slicing the silicon carbide ingot to have a certain off-angle. The off-angle is based on the (0001) plane in 4H SiC. The off-angle may be, in particular, an angle selected from 0° to 15°, may be an angle selected from 0° to 12°, and may be an angle selected from 0° to 8°.

The slicing may be performed by a slicing method that is conventionally used in the manufacture of a wafer. For example, cutting with a diamond wire or a wire to which a diamond slurry is applied, and cutting with a blade or a wheel to which a diamond is partially applied, may be used, but the present invention is not limited thereto.

The thickness of the sliced crystal may be adjusted in consideration of the thickness of the wafer to be manufactured, and may be sliced to an appropriate thickness in consideration of the thickness of the wafer after ground in the grinding step described as follows.

In addition, the slicing starts at a place about 3° away from the point where the outer circumferential surface of the silicon carbide ingot and the second direction meet, and proceeds in the second direction. That is, the direction in which the slicing proceeds may be a direction deviated by about 3° from the second direction. That is, the movement direction of the sawing wire for the slicing may be a direction perpendicular to the second direction and a direction inclined by about 3°. That is, the extension direction of the sawing wire is a direction perpendicular to the second direction and a direction inclined by about 3°, and the silicon carbide ingot is gradually cut in a direction inclined by about 3° from the second direction, and can be cut.

Accordingly, in the slicing process, the occurrence of stress in the first direction may be minimized. That is, in the slicing process, since no pressure is applied in the first direction in the slicing process, the stress in the first direction is minimized, and the deviation of the peak omega angle in the first direction may be minimized.

The polishing step is a step of forming a silicon carbide wafer by grinding the sliced crystal to a thickness of 300 μm to 800 μm.

In the polishing step, a grinding method commonly applied to the manufacture of a wafer may be applied. For example, after a process such as lapping and/or grinding is performed, polishing or the like may be carried out.

Hereinafter, embodiments will be described in further detail with reference to specific examples. The following examples are only for illustrative purposes to aid understanding and are not intended to limit the scope of the invention disclosed in the present specification.

Preparation of Samples of Examples and Comparative Example

Powder including SiC particles were loaded into a graphite crucible body. A SiC seed crystal and a seed crystal holder were provided over the powder. At this time, the C plane of the SiC seed crystal (4H SiC single crystal, 6 inches) was fixed by a general method to face the lower portion of a crucible. In addition, a crucible cover and the seed crystal holder are integrally formed of graphite, and both the crucible cover and the seed crystal holder has a disc shape. In this case, the crucible cover had a thickness of about 20 mm, the crucible cover had a diameter of about 210 mm, the seed crystal holder had a thickness of about 3 mm, and the seed crystal holder had a diameter of about 180 mm. In addition, a first direction, in which an upper surface of the seed crystal and a (11-20) plane of the seed crystal cross each other, and a specific direction of the seed crystal holder coincided with each other. In addition, the thermal conductivities of the crucible cover and the seed crystal holder based on a direction coinciding with the first direction were measured as shown in Table 1 below.

The crucible body in which the seed crystal and the seed crystal holder were provided was covered with the crucible cover, and wrapped with a heat insulating material, and then placed in a reaction chamber equipped with a heating coil as a heating means.

In this case, a graphite felt having a density of 0.19 g/cc, a porosity of 85%, and a compressive strength of 0.37 Mpa was applied as the heat insulating material.

The inside of a crucible was depressurized to create a vacuum state, and then argon gas was slowly injected thereinto so that the inside of the crucible reached atmospheric pressure, and then the inside of the crucible was slowly depressurized again. At the same time, the temperature inside the crucible was slowly raised at a heating rate of about 3° C./min up to 2,000° C., and slowly raised at a heating rate of about 5° C./min up to 2,350° C.

Subsequently, a SiC ingot was grown from a SiC seed crystal for 100 hours under conditions of a temperature of 2,350° C. and a pressure of 20 torr.

Thereafter, the SiC ingot was cut by a diamond wire saw with respect to a direction deviated by about 3° from a second direction perpendicular to the first direction, and processed by a chamfering process, a grinding process, and a polishing process. Accordingly, a SiC wafer having an off-angle of 4° with respect to a (0001) plane was manufactured. In a comparative example, the SiC ingot was cut with respect to the first direction.

TABLE 1

| Classification | Thermal conductivity (W/mK, with respect to a (11-20) plane) |
|---|---|
| Example 1 | 120 |
| Example 2 | 115 |
| Example 3 | 111 |
| Example 4 | 130 |
| Example 5 | 130 |
| Example 6 | 140 |
| Example 7 | 118 |

TABLE 1-continued

| Classification | Thermal conductivity (W/mK, with respect to a (11-20) plane) |
|---|---|
| Example 8 | 115 |
| Example 9 | 116 |
| Example 10 | 105 |
| Example 11 | 106 |
| Example 12 | 101 |
| Comparative Example | 80 |

Evaluation of Physical Properties of Examples and Comparative Example (1) Rocking Curve By using a high-resolution X-ray diffraction analysis system (HR-XRD system, Rigaku SmartLab High Resolution X-ray Diffraction System), the [11-20] direction of each of the wafers of the examples was aligned with an X-ray path, an angle between an X-ray source optic and an X-ray detector optic was set to $2\theta$ (35° to 36°), and then an omega ($\omega$, or theta $\theta$, X-ray detector optic) angle was adjusted according to the off-angle of the wafer for measurement.

X-ray power was 9 kW, Cu was applied as an X-ray target, and Goniometer resolution was 0.0001.

The HR-XRD was measured in the C plane, and measured at the center of the C plane up to about 60 mm from the center at intervals of about 15 mm in the first direction, thereby deriving a rocking curve at each measuring point. In addition, the HR-XRD was measured up to about 60 mm from the center at intervals of about 15 mm in the second direction, thereby deriving a rocking curve at each measuring point.

(2) Drop Ball Test

Each of the silicon carbide wafers manufactured according to Examples and Comparative Example was cut to a size of 50 mm×50 mm, and the presence or absence of cracks in each sample according to potential energy by the DuPont impact test and collision with a 30 g weight was observed with the naked eye. The weight was free-fallen from a height of about 100 mm and at a potential energy of about 0.0294 J to be collided with the sample. The presence or absence of cracks was observed with the naked eye.

O: No cracks

X: Cracks present (3) Flatness

The flatness (warp and bow) of each of the wafers manufactured according to Examples and Comparative Example was measured by a flatness tester (FT-900, NIDEK).

Results of Evaluation of Physical Properties of Examples and Comparative Example A first peak omega angle in each rocking curve in the first direction is shown in Table 2 below. Each measuring point is distanced by mm from the center, and the unit of the first peak omega angle is a degree (°).

TABLE 2

| Classification | −60 mm | −45 mm | −30 mm | −15 mm | Center | 15 mm | 30 mm | 45 mm | 60 mm |
|---|---|---|---|---|---|---|---|---|---|
| Example 1 | 13.78 | 13.78 | 13.77 | 13.77 | 13.77 | 13.76 | 13.76 | 13.76 | 13.77 |
| Example 2 | 13.79 | 13.79 | 13.79 | 13.78 | 13.78 | 13.78 | 13.78 | 13.78 | 13.78 |
| Example 3 | 13.79 | 13.81 | 13.76 | 13.76 | 13.76 | 13.77 | 13.78 | 13.79 | 13.79 |
| Example 4 | 13.72 | 13.73 | 13.74 | 13.75 | 13.72 | 13.72 | 13.73 | 13.75 | 13.76 |
| Example 5 | 13.70 | 13.72 | 13.73 | 13.73 | 13.74 | 13.74 | 13.75 | 13.76 | 13.78 |
| Example 6 | 13.74 | 13.74 | 13.74 | 13.74 | 13.73 | 13.73 | 13.72 | 13.72 | 13.72 |
| Example 7 | 13.76 | 13.77 | 13.77 | 13.77 | 13.77 | 13.77 | 13.77 | 13.77 | 13.77 |
| Example 8 | 13.69 | 13.69 | 13.69 | 13.69 | 13.69 | 13.68 | 13.66 | 13.66 | 13.66 |
| Example 9 | 13.57 | 13.67 | 13.67 | 13.71 | 13.76 | 13.78 | 13.83 | 13.86 | 13.89 |
| Example 10 | 13.77 | 13.77 | 13.78 | 13.79 | 13.80 | 13.81 | 13.83 | 13.84 | 13.89 |
| Example 11 | 14.12 | 14.05 | 13.97 | 13.89 | 13.80 | 13.73 | 13.65 | 13.58 | 13.51 |
| Example 12 | 14.51 | 14.43 | 14.34 | 14.26 | 14.18 | 14.09 | 14.00 | 13.93 | 13.84 |
| Comparative Example | 13.19 | 13.32 | 13.45 | 13.58 | 13.72 | 13.84 | 13.96 | 14.09 | 14.23 |

A second peak omega angle in each rocking curve in the second direction is shown in Table 3 below. Each measuring point is distanced by mm from the center, and the unit of the second peak omega angle is a degree (°).

TABLE 3

| Classification | −60 mm | −45 mm | −30 mm | −15 mm | Center | 15 mm | 30 mm | 45 mm | 60 mm |
|---|---|---|---|---|---|---|---|---|---|
| Example 1 | 13.72 | 13.72 | 13.72 | 13.74 | 13.77 | 13.79 | 13.81 | 13.81 | 13.81 |
| Example 2 | 13.84 | 13.82 | 13.80 | 13.80 | 13.78 | 13.77 | 13.75 | 13.75 | 13.75 |
| Example 3 | 13.83 | 13.81 | 13.79 | 13.79 | 13.76 | 13.76 | 13.77 | 13.76 | 13.75 |
| Example 4 | 13.80 | 13.77 | 13.75 | 13.74 | 13.72 | 13.75 | 13.73 | 13.72 | 13.71 |
| Example 5 | 13.82 | 13.79 | 13.77 | 13.76 | 13.74 | 13.72 | 13.70 | 13.68 | 13.67 |
| Example 6 | 13.77 | 13.76 | 13.75 | 13.75 | 13.73 | 13.73 | 13.72 | 13.71 | 13.70 |
| Example 7 | 13.86 | 13.84 | 13.81 | 13.79 | 13.77 | 13.74 | 13.73 | 13.72 | 13.71 |
| Example 8 | 13.72 | 13.71 | 13.70 | 13.70 | 13.69 | 13.67 | 13.65 | 13.64 | 13.62 |
| Example 9 | 13.60 | 13.64 | 13.67 | 13.72 | 13.76 | 13.79 | 13.83 | 13.89 | 13.94 |
| Example 10 | 13.95 | 13.89 | 13.86 | 13.83 | 13.80 | 13.77 | 13.74 | 13.69 | 13.64 |
| Example 11 | 13.76 | 13.77 | 13.78 | 13.80 | 13.80 | 13.81 | 13.82 | 13.82 | 13.83 |
| Example 12 | 14.54 | 14.45 | 14.35 | 14.27 | 14.18 | 14.08 | 13.99 | 13.90 | 13.81 |
| Comparative Example | 13.86 | 13.83 | 13.78 | 13.76 | 13.72 | 13.67 | 13.64 | 13.60 | 13.58 |

A rate of change in the first peak omega angle according to a position in the first direction, a rate of change in the second peak omega angle according to a position in the second direction, flatness, and drop ball test results are shown in Table 4 below.

TABLE 4

| Classification | Rate of change in first peak omega angle (°/10 mm) | Rate of change in second peak omega angle (°/10 mm) | Drop ball test |
|---|---|---|---|
| Example 1 | 0.00375 | 0.01125 | ○ |
| Example 2 | 0.00125 | 0.01125 | ○ |
| Example 3 | 0.0125 | 0.0125 | ○ |
| Example 4 | 0.0125 | 0.01875 | ○ |
| Example 5 | 0.01 | 0.01875 | ○ |
| Example 6 | 0.0025 | 0.00875 | ○ |
| Example 7 | 0.00125 | 0.01875 | ○ |
| Example 8 | 0.00375 | 0.0125 | ○ |
| Example 9 | 0.04 | 0.0425 | ○ |
| Example 10 | 0.01125 | 0.03875 | ○ |
| Example 11 | 0.07625 | 0.00875 | ○ |
| Example 12 | 0.08375 | 0.09125 | ○ |
| Comparative Example | 0.13 | 0.035 | X |

TABLE 5

| | Warp (μm) | Bow (μm) |
|---|---|---|
| Example 1 | 17.038 | −5.963 |
| Example 2 | 23.917 | −9.449 |
| Example 3 | 19.062 | −2.640 |
| Example 4 | 39.998 | −6.193 |
| Example 5 | 26.188 | 3.646 |
| Example 6 | 24.224 | 2.778 |
| Example 7 | 34.573 | −23.628 |
| Example 8 | 15.100 | 4.551 |
| Example 9 | 64.564 | 48.263 |
| Example 10 | 15.098 | 3.559 |
| Example 11 | 53.274 | 39.622 |
| Example 12 | 69.388 | 52.498 |
| Comparative Example | 92.170 | 72.749 |

The silicon carbide wafers according to Examples have a small deviation of a peak omega angle and a small rate of change in the peak omega angle, and thus have enhanced mechanical rigidity and flatness (warp and bow).

While exemplary embodiments of the present invention have been described in detail, the scope of the present invention is not limited thereto, and various modifications and improvements made by those of ordinary skill in the art using the basic concept of the present invention as defined in the following claims fall within the scope of the present invention.

DESCRIPTION OF REFERENCE NUMERALS

Silicon carbide wafer 10
Upper surface of wafer 100
Lower surface of wafer 200

The invention claimed is:

1. A silicon carbide wafer comprising an upper surface and a lower surface,
   wherein the upper surface comprises a first target region, the first target region being within 85% of a radius of the upper surface based on a center of the upper surface,
   wherein, in the first target region, a first peak omega angle in a rocking curve measured at intervals of 15 mm in a first direction is within −0.5° to +0.5° based on a peak omega angle in a rocking curve measured at the center of the upper surface,
   wherein the first direction is a [1-100] direction and a direction passing through the center of the upper surface.

2. The silicon carbide wafer according to claim 1, wherein an off-angle selected from 0° to 15° based on a (0001) plane is applied, and the upper surface is a C plane.

3. The silicon carbide wafer according to claim 2, wherein the first peak omega angle ranges from −0.3° to +0.3° based on the peak omega angle at the center.

4. The silicon carbide wafer according to claim 2, wherein the first peak omega angle ranges from −0.2° to +0.2° based on the peak omega angle at the center.

5. The silicon carbide wafer according to claim 2, wherein the first peak omega angle ranges from −0.05° to +0.05° based on the peak omega angle at the center.

6. The silicon carbide wafer according to claim 2, wherein a rate of change in the first peak omega angle according to a position in the first direction is 0.1°/15 mm or less.

7. The silicon carbide wafer according to claim 2, wherein, in the target region, a second peak omega angle measured at intervals of 15 mm in a second direction is within −0.8° to +0.8° based on the peak omega angle at the center, and
   the second direction is a [11-20] direction and a direction passing through the center of the upper surface.

8. The silicon carbide wafer according to claim 7, wherein a rate of change in the second peak omega angle according to a position in the second direction is 0.2°/15 mm or less.

9. The silicon carbide wafer according to claim 8, wherein the rate of change in the first peak omega angle is smaller than the rate of change in the second peak omega angle.

10. The silicon carbide wafer according to claim 8, wherein the rate of change in the first peak omega angle is ⅔ times or less the rate of change in the second peak omega angle.

11. The silicon carbide wafer according to claim 1, wherein the lower surface comprises a second target region, the second target region being within 85% of a radius of the lower surface based on a center of the lower surface,
    wherein, in the second target region, a third peak omega angle in a rocking curve measured at intervals of 15 mm in a third direction is within −0.5° to +0.5° based on a peak omega angle in a rocking curve measured at the center of the lower surface,
    wherein the third direction is a [1-100] direction and a direction passing through the center of the lower surface.

12. The silicon carbide wafer according to claim 11, wherein an off-angle selected from 0° to 15° based on a (0001) plane is applied, and the lower surface is a Si plane.

13. A method of manufacturing a silicon carbide wafer, comprising:
    manufacturing a silicon carbide ingot;
    slicing the silicon carbide ingot; and
    polishing the sliced upper surface and lower surface,
    wherein the polished upper surface comprises a first target region, the first target region being within 85% of a radius of the upper surface based on a center of the upper surface,
    wherein, in the first target region, a first peak omega angle in a rocking curve measured at intervals of 15 mm in a first direction is within −0.5° to +0.5° based on a peak omega angle in a rocking curve measured at the center of the upper surface,
    wherein the first direction is a [1-100] direction and a direction passing through the center of the upper surface.

14. The method according to claim 13, wherein the manufacturing of the silicon carbide ingot comprises:
    preparing a holder having thermally conductive anisotropy;
    attaching a seed crystal to the holder; and
    depositing silicon carbide on the seed crystal, and
    in the attachment of the seed crystal to the holder, the seed crystal is attached to the holder so that a direction in which thermal conductivity is 100 W/mK or more, among directions horizontally passing through a center of the holder, and a [1-100] direction of the seed crystal correspond to each other.

\* \* \* \* \*